(12) United States Patent
Kondo et al.

(10) Patent No.: US 6,545,365 B2
(45) Date of Patent: Apr. 8, 2003

(54) RESIN-SEALED CHIP STACK TYPE SEMICONDUCTOR DEVICE

(75) Inventors: Takashi Kondo, Tokyo (JP); Koji Bando, Tokyo (JP); Jun Shibata, Tokyo (JP); Kazuko Narutaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/781,237

(22) Filed: Feb. 13, 2001

(65) Prior Publication Data

US 2001/0035587 A1 Nov. 1, 2001

(30) Foreign Application Priority Data

Apr. 26, 2000 (JP) .......................... 2000-125579

(51) Int. Cl.[7] .................. H01L 23/48; H01L 23/52; H01L 29/40; H01L 23/34
(52) U.S. Cl. .................. 257/777; 257/782; 257/783; 257/723
(58) Field of Search ................ 257/777, 723, 257/782, 783

(56) References Cited

U.S. PATENT DOCUMENTS 4,947,234 A  *  8/1990  Einzinger et al. ............. 357/68
6,133,637 A  * 10/2000  Hikita et al. ................. 257/777
6,157,074 A  * 12/2000  Lee .............................. 257/666

FOREIGN PATENT DOCUMENTS

| JP | 5-226565  | 9/1993  |
| JP | 8-107178  | 4/1996  |
| JP | 8-288455  | 11/1996 |
| JP | 11-251512 | 9/1999  |

* cited by examiner

Primary Examiner—Stephen D. Meier
Assistant Examiner—Kiesha Rose
(74) Attorney, Agent, or Firm—McDermott, Will & Emery

(57) ABSTRACT

A resin-sealed chip stack type semiconductor device comprises a substrate placed on many balls, a bottom chip to which wires are connected, a top chip to which wires are connected and mounted above the bottom chip, a non-conductive bonding layer which functions to bond and fix the two chips to each other, and a sealing resin which covers and protects all the components mounted on the substrate. The non-conductive bonding layer is provided by die bonding in such a manner that is at least covers the portion of the bottom chip where the corresponding wires are connected and does not allow generation of a gap between the two chips.

4 Claims, 3 Drawing Sheets

RESIN-SEALED CHIP STACK TYPE SEMICONDUCTOR DEVICE

FIELD OF THE INVENTION

The present invention relates to a resin-sealed chip stack type semiconductor device in which chips are mounted one above the other thereby eliminating a space between the chips and thus realizing a dense arrangement of the chips in the device.

BACKGROUND OF THE INVENTION

FIG. 5 shows a cross-section of the conventional resin-sealed ball grided array (BGA) type of semiconductor device. Legend 11 represents a ball and there are a plurality of them. Legend 12 represents a substrate placed on the balls 11. Legend 13 represents a chip (hereafter, first chip) mounted on the substrate 12. Legend 14 represents a chip (hereafter, second chip) mounted above the first chip 13. Legend 13a and 14a are the wires that connect the first chip 13 and the second chip 14. Legend 15 represents a sealing resin which covers and protects anything and everything arranged above the substrate 12. Filler is mixed into this sealing resin in order to enhance the thermal conductivity of the sealing resin. Thus, the conventional resin-sealed BGA type semiconductor device has a structure in which two or more chips of different sizes are stacked one above the other and the chips are incorporated in one package.

However, when the chips are stacked in this manner, there arises a problem that a short-circuit occurs between the wire 13a of the first chip 13 and the second chip 14. Similarly, there arises a problem that a short-circuit occurs between the wire 13a of the first chip 13 and the wire 14a of the second chip 14. In addition, there has been a problem that the filler mixed into the sealing resin forcefully penetrates in between the first chip 13 and the second chip 14 and damages the chips.

SUMMARY OF THE INVENTION

It is an object of this invention to obtain a resin-sealed chip stack type semiconductor device that can avoid a short-circuit between the wires and the chips, between wires, and prevent the damage of the chips due to penetration of the filler which is mixed into the sealing resin.

The resin-sealed chip stack type semiconductor device according to the present invention comprises a substrate placed on many balls, a bottom chip to which wires are connected, a top chip to which wires are connected and mounted above the bottom chip, a non-conductive bonding layer which functions to bond and fix the two chips to each other, and a sealing resin which covers and protects all the components mounted on the substrate. The non-conductive bonding layer is provided by die bonding in such a manner that is at least covers the portion of the bottom chip where the corresponding wires are connected and does not allow generation of a gap between the two chips.

Other objects and features of this invention will become apparent from the following description with reference to the accompanying drawings.

DESCRIPTION OF THE PREFERRED EMBODIMENTS

Figure 1:
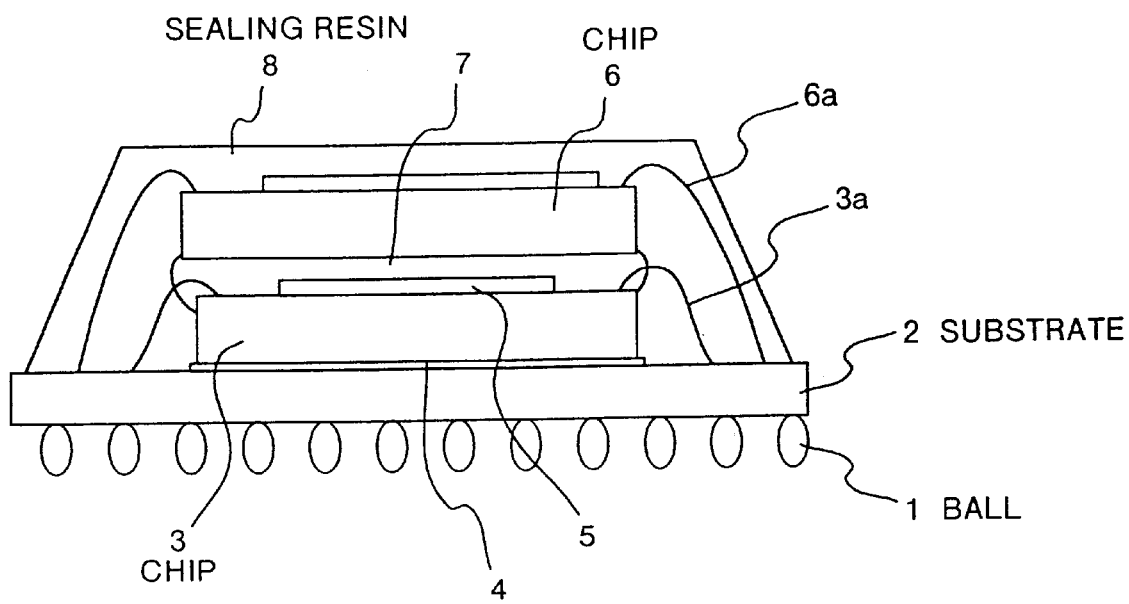
FIG. 1 shows a cross-section of a resin-sealed BGA type semiconductor device according to a first embodiment of this invention.

Preferred embodiments of this invention will be explained below with reference to the attached drawings. FIG. 1 is a cross-sectional view of a resin-sealed BGA type semiconductor device according to a first embodiment of this invention. Legend 1 represents a ball and there are a plurality of them. Legend 2 represents a substrate placed on the balls 1. Legend 3 represents a chip (hereafter, first chip) mounted on the substrate 2 with a fixing material 4. Legend 5 represents a layer that overcoats the first chip 3. Legend 6 represents a chip (hereafter, second chip) mounted using a bonding layer 7. This bonding layer 7 is made of die-bonding resin. Legend 3a represents a wire that is connected to the first chip 3 and legend 6a represents a wire that is connected to the second chip 6. Legend 8 represents a sealing resin with which covers and protects anything and everything arranged above the substrate 2.

This resin-sealed BGA type semiconductor device is formed in the following manner. First, the first chip 3 is mounted on the substrate 2. Then, the portion around the contact of the wire 3a of the first chip 3 is covered with a die bonding resin to form the bonding layer 7. Further, die bonding resin sufficient enough to eliminate the space between the first chip 3 and the second chip 6 is applied. After that, the second chip 6 is mounted above the first chip 3. While mounting the second chip 6 care is taken such that the wire 3a of the first chip 3 and the second chip 6 and the wire 3a and the wire 6a of the second chip do not short-circuit. In addition, care is taken such that the sealing resin does not penetrate into the space between the first chip 3 and the second chip 6. If the sealing resin penetrates in the space between the chips then the filler mixed into this sealing resin also penetrates into this space and damages the chips.

In this manner, it is possible to provide a high-reliability multifunctional semiconductor device in which the wire 3a and the second chip 6, and the wires 3a and 6a do not short-circuit even if the device stores a plurality of chips of almost the same size. Further, penetration of the sealing resin into the space between the chips can be prevented thereby avoiding the damage of the chips. As a consequence, a high reliable stack-type resin-sealed BGA type semiconductor device can be obtained.

Figure 2:
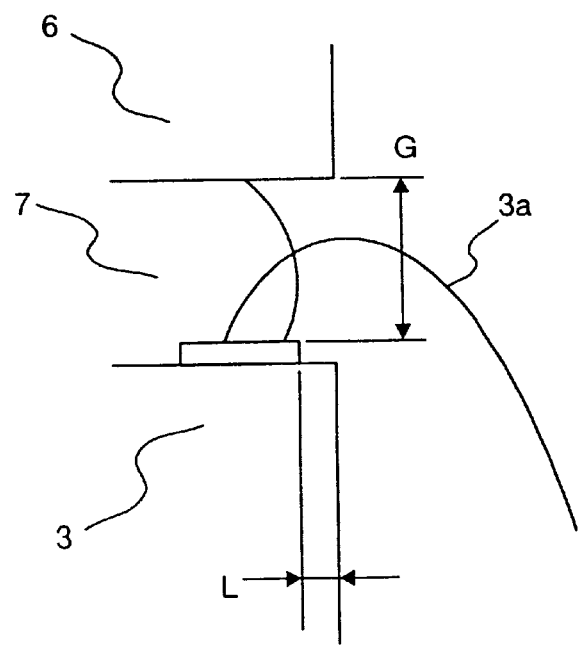
FIG. 2 is an enlarged cross-sectional view of the resin-sealed BGA type semiconductor device according to the first embodiment of this invention.
Figure 3:
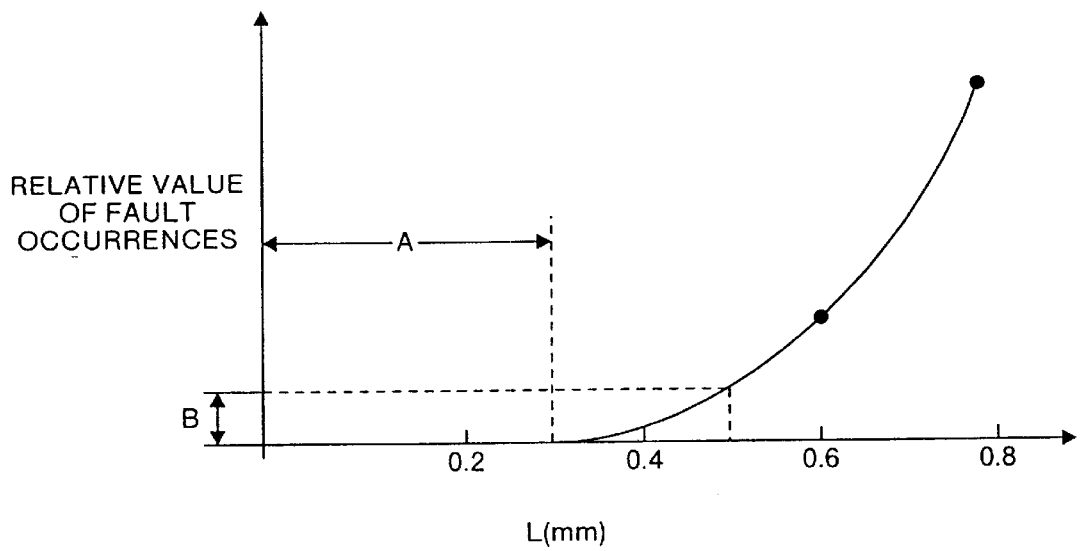
FIG. 3 shows a relationship between the amount of retreat and the possibility of fault occurrence.

FIG. 2 is an enlarged cross-sectional view of the bonding edges of the first chip 3 and the second chip 6. FIG. 3 shows a relationship between the amount of retreat of the bonding layer 7 and the possibility of fault occurrence. In these figures, legend L represents the amount of retreat of the bonding layer. Legend A represents a control region, where fault occurrences are substantially suppressed by a feeder within this resin-sealed BGA type semiconductor device. Further, legend B represents the rate of fault occurrence at a practical level.

It is clear from the se figures that, although minute variation in the amount retreat L of the bonding layer 7 does not matter, the amount of retreat should preferably be less than 0.5 mm.

Figure 4:
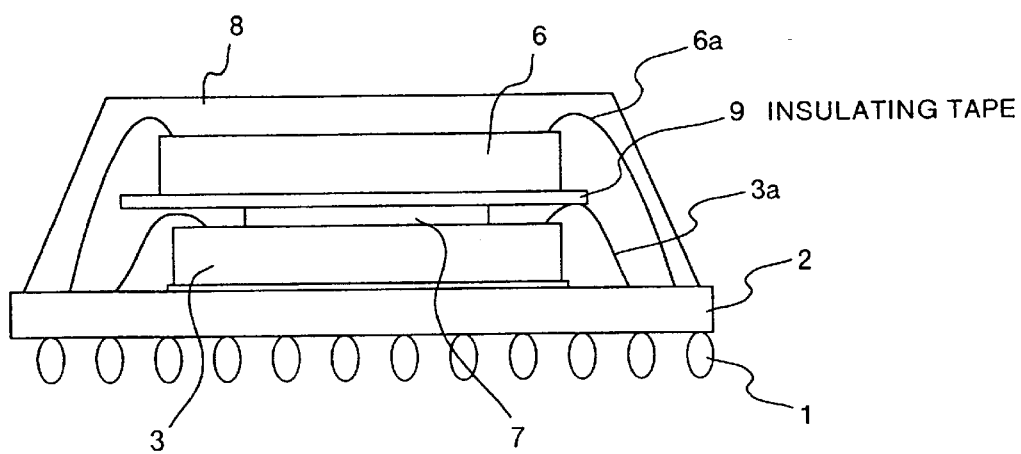
FIG. 4 shows a cross-section of a resin-sealed BGA type semiconductor device according to a second embodiment of this invention.
Figure 5:
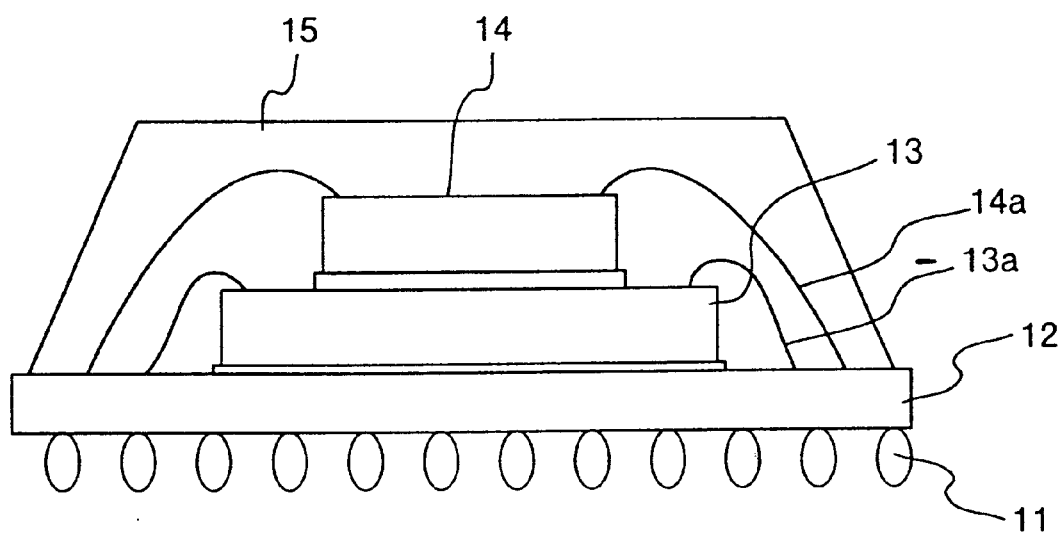
FIG. 5 shows a cross-section of the conventional resin-sealed BGA type semiconductor device.

FIG. 4 shows a,cross-section of a resin-sealed BGA type semiconductor device according to a second embodiment of this invention. As shown in FIG. 4, a film-shaped insulating tape 9 is sandwiched between the bonding layer 7 and the second chip 6 so as to cover the wire 3a of the first chip 3, and the second chip 6 is die-bonded to the tape. Accordingly, it is possible to prevent a short-circuit between the first chip 3 and the second chip 6, the wire 3a of the first chip 3 and the second chip 6, and the wire 3a of the first chip 3 and the wire 6a of the second chip 6. Especially, the insulating tape 9 extends outward from the edge of the second chip 6, therefore, a short-circuit between the wire 3a and the second chip 6 or between the wire 3a and the wire 6a can surely be prevented. Further, the insulating tape 9 suppresses the inclination of the second chip 6.

However, it is difficult to prevent the sealing resin from penetrating into the space between the insulating tape 9 and the first chip 3. However, this problem can be solved by considerably increasing the thickness of the bonding layer 7.

The thickness of the bonding layer 7 has a relation with the size of the filler in the sealing resin to be used. It has been confirmed with experiments that, in practice, the gap G shown in FIG. 2 should be around twice as large as the filler size. The smaller is the filler size, the more reliable it is, but that increases the manufacturing cost of the sealing resin.

Although the BAG type semiconductor device is explained in the first and second embodiments, this invention is not limited to these embodiments. For example, this invention may be applicable in a semiconductor device in which a plurality of chips are stacked one above the other within one package.

According to this invention, the substrate is placed on the balls, and a plurality of stacked chips are mounted on the substrate, and the whole thing is covered with the sealing resin. Further, the bonding layer which covers at least around the contact of the wire connected to the lower chip and does not allow a gap between the lower chip and the upper chip is provided. Therefore, it is possible to avoid the short-circuit between the chip and the wire or between the wires and also prevent penetration of the sealing resin into the space between the chips. The size of the upper chip may be almost the same as that of the lower chip, which makes it possible to release restriction to the size of the chips stored in the same package, thus flexible chip stack can be realized.

Further, insulating film is provided between the bonding layer and the upper chip. Therefore, it is possible to prevent the short-circuit between the chips, between the chip and the wire, and between the wires. Accordingly, a highly reliable resin-sealed chip stack type semiconductor device can be realized.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A resin-sealed chip stack type semiconductor device which is obtained by placing a substrate on balls, mounting a plurality of stacked chips on said substrate, covering the whole with a sealing resin, wherein a bonding layer, that covers at least around a contact part of a wire connected to a lower chip and does not allow a gap between the lower chip and an upper chip, is coated, and providing an insulating film between said bonding layer and said upper chip, said insulating film extends away from said upper chip and covers the wire connected to the lower chip.

2. A resin-sealed chip stack type semiconductor device comprising:

balls;

a substrate placed on said balls, a bottom chip to which wires are connected;

a top chip to which wires are connected and mounted above said bottom chip;

a non-conductive bonding layer which functions to bond said two chips to each other;

an insulating film between said bonding layer and said top chip, said insulating film extends away from said top chip and covers the wire connected to the bottom chip; and a sealing resin which covers and protects components mounted on said substrate, wherein said non-conductive bonding layer at least covers the portion of said bottom chip where the corresponding wires are connected and does not allow generation of a gap between said two chips.

3. A resin-sealed chip stack type semiconductor device according to claim 1, wherein a size of the upper chip and a size of the lower chip are approximately the same.

4. A resin-sealed chip stack type semiconductor device according to claim 2, wherein a size of the upper chip and a size of the lower chip are approximately the same.

* * * * *